(12) United States Patent
Young et al.

(10) Patent No.: US 10,749,052 B2
(45) Date of Patent: Aug. 18, 2020

(54) METHODS OF FORMING INTERDIGITATED BACK CONTACT SOLAR CELLS

(71) Applicant: Alliance for Sustainable Energy, LLC, Golden, CO (US)

(72) Inventors: David Levi Young, Golden, CO (US); Myles Aaron Steiner, Denver, CO (US); John David Simon, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 164 days.

(21) Appl. No.: 15/895,183

(22) Filed: Feb. 13, 2018

(65) Prior Publication Data

US 2018/0233607 A1    Aug. 16, 2018

Related U.S. Application Data

(60) Provisional application No. 62/458,666, filed on Feb. 14, 2017.

(51) Int. Cl.
| | |
|---|---|
| *H01L 31/044* | (2014.01) |
| *H01L 31/0224* | (2006.01) |
| *H01L 31/18* | (2006.01) |
| *H01L 31/0304* | (2006.01) |
| *H01L 31/0693* | (2012.01) |
| *H01L 31/068* | (2012.01) |

(Continued)

(52) U.S. Cl.
CPC ........ *H01L 31/022458* (2013.01); *H01L 31/022441* (2013.01); *H01L 31/03042* (2013.01); *H01L 31/03046* (2013.01); *H01L 31/047* (2014.12); *H01L 31/0682* (2013.01); *H01L 31/0693* (2013.01); *H01L 31/0735* (2013.01); *H01L 31/1844* (2013.01); *H01L 31/1868* (2013.01); *H01L 31/1892* (2013.01); *Y02E 10/544* (2013.01); *Y02P 70/521* (2015.11)

(58) Field of Classification Search
CPC .................. H01L 31/00–078; Y02E 10/50–60
USPC ............................ 136/243–265; 438/57–98
See application file for complete search history.

(56) References Cited

U.S. PATENT DOCUMENTS

| | | | |
|---|---|---|---|
| 4,897,123 A * | 1/1990 | Mitsui | H01L 31/022425 136/249 |
| 6,166,320 A | 12/2000 | Nagashima et al. | |
| 6,340,788 B1 | 1/2002 | King et al. | |

(Continued)

OTHER PUBLICATIONS

Almansouri, I. et al., "Supercharging Silicon Solar Cell Performance by Means of Multijunction Concept," IEEE Journal of Photovoltaics, vol. 5, No. 3, May 2015, pp. 968-976.

(Continued)

*Primary Examiner* — Bach T Dinh
(74) *Attorney, Agent, or Firm* — Sam J. Barkley

(57) ABSTRACT

Methods for forming interdigitated back contact solar cells from III-V materials are provided. According to an aspect of the invention, a method includes depositing a patterned Zn layer to cover first areas of an n-type emitter region, wherein the emitter region comprises a III-V material, and forming a passivated back contact region by counter-doping the first areas of the emitter region by diffusing Zn from the patterned Zn layer into the first areas of the emitter region, such that the first areas of the emitter region become p-type.

3 Claims, 2 Drawing Sheets

(51) Int. Cl.
*H01L 31/047* (2014.01)
*H01L 31/0735* (2012.01)

(56) References Cited

U.S. PATENT DOCUMENTS

| | | | |
|---|---|---|---|
| 8,242,354 B2 | 8/2012 | Smith | |
| 8,614,395 B1* | 12/2013 | Nielson | H01L 31/022441 136/256 |
| 2010/0307591 A1* | 12/2010 | Bedell | H01L 31/0725 136/262 |
| 2012/0107997 A1* | 5/2012 | Kim | H01L 31/0682 438/72 |
| 2012/0305072 A1 | 12/2012 | Fujimori et al. | |
| 2014/0209149 A1* | 7/2014 | Mascarenhas | H01L 31/0687 136/249 |
| 2014/0295613 A1 | 10/2014 | O'Sullivan | |
| 2015/0162478 A1* | 6/2015 | Fafard | H01L 31/0304 257/461 |
| 2015/0162483 A1 | 6/2015 | Weidman et al. | |
| 2016/0020342 A1 | 1/2016 | Heng et al. | |
| 2018/0374977 A1 | 12/2018 | Geerligs et al. | |

OTHER PUBLICATIONS

Bush, K. et al., "23.6%-efficient monolithic perovskite/silicon tandem solar cells with improved stability," Nature Energy, vol. 2, 2017, pp. 1-7.
Cariou, R. et al., "Monolithic Two-Terminal III-V//Si Triple-Junction Solar Cells With 30.2% Efficiency Under 1-Sun AM 1.5g," IEEE Journal of Photovoltaics, vol. 7, No. 1, Jan. 2016, pp. 367-373.
Das, U. et al., "The role of back contact patterning on stability and performance of Si IBC heterojunction solar cells," IEEE, 2014, pp. 0590-0593.
Duong, T., "Rubidium Multication Perovskite with Optimized Bandgap for Perovskite-Silicon Tandem with over 26% Efficiency," Advanced Energy Materials, vol. 7, 2017, 11 pages.
Essig, S. et al., "Progress towards a 30% efficient GaInP/Si tandem solar cell," Energy Procedia, vol. 77, 2015, pp. 464-469.
Essig, S. et al., "Realization of GaInP/Si Dual-Junction Solar Cells With 29.8% 1-Sun Efficiency," IEEE Journal of Photovoltaics, vol. 6, No. 4, Jul. 2016, pp. 1012-1019.
Essig, S. et al., "Boosting the efficiency of III-V/Si tandem solar cells," 43rd IEEE Photovoltaic Specialists Conference, Jun. 2016, pp. 2040-2042.
Essig, S. et al., "Mechanically stacked 4-terminal III-V/Si tandem solar cells," 44th IEEE Photovoltaics Conference, 2017, 2 pages.
Gee, J. et al., "A 31%-Efficient GaAs/Silicon Mechanically Stacked, Multijunction Concentrator Solar Cell," IEEE Electron Device Letters, 1988, pp. 754-758.
Geisz, J. et al., "Enhanced external radiative efficiency for 20.8% efficient single-junction GaInP solar cells," Applied Physics Letters, vol. 3, 2013, pp. 041118-1 through 041118-5.
Green, M. et al., "Solar cell efficiency tables (version 49), Progress in Photovoltaics: Research and Applications," vol. 25, 2017, pp. 3-13.
Haase, F. et al., "Interdigitated back contact solar cells with polycrystalline silicon on oxide passivating contacts for both polarities," Japanese Journal of Applied Physics, vol. 56, 2017, 5 pages.
Hamon, G. et al., "Direct Growth of Crystalline Silicon on GaAs by Low Temperature PECVD: Towards Hybrid Tunnel Junctions for III-V/Si Tandem Cells," 43rd IEEE Photovoltaics Specialists Conference, Jun. 2016, pp. 1895-1897.
Herasimenka, S. et al., "A Simplified Process Flow for Silicon Heterojunction Interdigitated Back Contact Solar Cells: Using Shadow Masks and Tunnel Junctions," IEEE, 2014, pp. 2486-2490.
Jain, N. et al., "Development of Lattice-Matched 1.7 eV GaInAsP Solar Cells grown on GaAs by MOVPE," IEEE 43rd Photovoltaic Specialists Conference, 2016, pp. 0046-0051.
Jimeno, J. et al., "Upgrading the Silicon IBC to the 40% efficiency," 2016 IEEE PVSC Conference, 6 pages.
Klein, T. et al., "Transparent Conductive Adhesives for Tandem Solar Cells," 44th IEEE Photovoltaics Conference, 2017, 6 pages.
Liu, H. et al., "The realistic energy yield potential of GaAs-on-Si tandem solar cells: a theoretical case study," Optics Express, vol. 23, No. 7, Apr. 6, 2015, p. A382.
NREL Best Research-Cell Efficiencies Chart, accessed Aug. 23, 2018, https://www.nrel.gpv/pv/assets/images/effiency-chart.png, 1 page.
Nagashima, T. et al., "Three-Terminal Tandem Solar Cells With a Back-Contact Type Bottom Cell," 28th IEEE Photovoltaic Specialists Conference, 2000, pp. 1193-1196.
Nagashima, T. et al., "Surface Passivation for Germanium and Silicon Back Contact Type Photovoltaic Cells," IEEE 4th World Conference on Photovoltaic Energy, May 2006, pp. 655-658.
Onno, A. et al., "Simulation study of GaAsP/Si tandem solar cells," Solar Energy Materials & Solar Cells, vol. 145, 2016, pp. 206-216.
Richter, A. et al., "Reassessment of the Limiting Efficiency for Crystalline Silicon Solar Cells," IEEE Journal of Photovoltaics, vol. 3, No. 4, Oct. 2013, 8 pages.
Rienacker, M. et al., "Junction Resistivity of Carrier-Selective Polysilicon on Oxide Junctions and Its Impact on Solar Cell Performance," IEEE Journal of Photovoltaics, vol. 7, No. 1, Jan. 2017, pp. 11-14.
Scherff, M., Novel Methode for Preparation of Interdigitated Back Contacted a-Si:H/c-Si Heterojunction Solar Cells, preprint to be published in the proceedings of the 26th European Photovoltaic Solar Energy Conference, Sep. 5-9, 2011, Hamburg, Germany, 5 pages.
Schnabel, M. et al., "III-V/Si Tandem Cells Utilizing Interdigitated Back Contact Si Cells and Varying Terminal Configurations," IEEE 44th Photovoltaic Specialists Conference, 2017, 7 pages.
Tomasi, A. et al., "Photolithography-free Interdigitated Back-Contacted Silicon Heterojunction Solar Cells with Efficiency >21%," IEEE, 2014, pp. 3644-3648.
Warren, E. et al., "Modeling three-terminal III-V/Si tandem solar cells," submitted to 44th IEEE Photovoltaics Conference, 2017, 4 pages.
Yang, G. et al., "IBC c-Si solar cells based on ion-implanted poly-silicon passivating contacts," Solar Energy Materials & Solar Cells, vol. 158, 2016, pp. 84-90.
Yoshikawa, K. et al., "6 inch High Efficiency Back Contact Crystalline Si Solar Cell Applying Heterojunction and Thinfilm Technology," 43rd Photovoltaic Specialists Conference, Jun. 2016, pp. 3366-3369.
Deppe, D.G., "Thermodynamic explanation to the enhanced diffusion of base dopant in AlGaAs—GaAs npn bipolar transistors," American Institute of Physics, vol. 56, No. 370, 1990, 3 pages.
Hong, C.Y. et al., "Back-Contacted Thin-Film GaAs Solar Cells," IEEE PVSC Conference, Jun. 5-10, 2016, Portland, Oregon, pp. 3629-3631.
Kanechika, M. et al., "A Vertical Insulated Gate AlGaN/GaN Heterojunction Field-Effect Transistor," the Japan Society of Applied Physics, 2007, 3 pages.
Takamoto, T. et al., "Mechanism of Zn and Si diffusion from a highly doped tunnel junction for InGaP/GaAs tandem solar cells," Journal of Applied Physics, vol. 85, No. 3, Feb. 1, 1999, 6 pages.

* cited by examiner

METHODS OF FORMING INTERDIGITATED BACK CONTACT SOLAR CELLS

CROSS-REFERENCE TO RELATED APPLICATION

This application claims priority from U.S. Provisional Application No. 62/458,666, filed Feb. 14, 2017, the disclosure of which is incorporated herein by reference in its entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

The present invention relates to interdigitated back contact (IBC) solar cells. The top three silicon solar cell efficiencies have been achieved by IBC device structures. The IBC solar cell architecture eliminates front grid shadow loss (2-5 absolute % points) and allows much lower contact resistance by permitting larger contact metal coverage with much easier one-sided cell-to-module integration.

Traditionally, IBC devices have been limited to long-diffusion-length silicon wafers for sufficient carrier transport to the emitter and back contact regions spaced 100 µm-1 mm apart. Patterned doping has been accomplished by ion implantation or multistep diffusion processes. However, no IBC solar cell having acceptable quality has been reported using III-V materials, due to the complex processing steps involved with patterned epitaxial growth and the need for closely spaced emitter/back-contact regions in short-diffusion-length III-V materials.

Accordingly, it would be advantageous to provide an improved method of forming IBC solar cells from III-V materials. Potential benefits of forming an IBC cell from III-V materials include increased efficiency through larger current densities (2-10% depending on concentration), lower contact resistance through larger contact areas (allowing higher fill factors at higher concentrations and lower-cost metals), and simpler fabrication cell and module processing steps compared with both-sides-contacted III-V solar cells.

SUMMARY

Exemplary embodiments of the invention provide methods for forming IBC solar cells from III-V materials. According to an aspect of the invention, a method includes depositing a patterned Zn layer to cover first areas of an n-type emitter region, wherein the emitter region comprises a III-V material, and forming a passivated back contact region by counter-doping the first areas of the emitter region by diffusing Zn from the patterned Zn layer into the first areas of the emitter region, such that the first areas of the emitter region become p-type.

The depositing of the patterned Zn layer may include electroplating a Zn layer on the emitter region, forming a mask on first areas of the Zn layer corresponding to the first areas of the emitter region, and removing Zn from second areas of the emitter region that are not covered by the mask. The mask may be formed by nanoimprinting or microlithography.

The n-type emitter region may be doped with Si, Se, S, and/or Te. The n-type emitter region may include an emitter layer, a minority carrier confinement layer, and a contact layer. The passivated back contact region may form a back surface field (BSF). The Zn may be diffused such that a concentration of the Zn within the passivated back contact region decreases from an interface with the patterned Zn layer to an interface with a base layer on a side of the passivated back contact region opposite to the patterned Zn layer.

The method may also include depositing a metal layer on at least a portion of the patterned Zn layer and at least a portion of the second areas of the emitter region.

According to another aspect of the invention, a device includes a base layer; an emitter region and a passivated back contact region formed on the base layer, wherein areas of the emitter region alternate with areas of the passivated back contact region; and a Zn layer formed on the passivated back contact region. The emitter region includes a III-V material, the passivated back contact region includes the III-V material, and the passivated back contact region is doped with Zn.

The emitter region may be n-type and the passivated back contact region may be p-type. The emitter region may be doped with Si, Se, S, and/or Te. The emitter region may include an emitter layer formed on the base layer, a minority confinement layer formed on the emitter layer, and a contact layer formed on the minority confinement layer.

A concentration of the Zn within the passivated back contact region may decrease from an interface with the Zn layer to an interface with the base layer. A thickness of the passivated back contact region may be less than a width of each of the areas of the emitter region and the areas of the passivated back contact region. The thickness of the passivated back contact region may be less than 100 nm. The passivated back contact region may form a back surface field. The device may also include a metal layer formed on at least a portion of the Zn layer and at least a portion of the emitter region.

Other objects, advantages, and novel features of the present invention will become apparent from the following detailed description of the invention when considered in conjunction with the accompanying drawings.

DETAILED DESCRIPTION

Exemplary embodiments of the present invention provide methods of forming IBC solar cells from III-V materials. This may be accomplished by forming patterned, well-passivated, back contacts by counter-doping diffusion rather than by epitaxial growth. This process is largely unexplored in III-V devices, yet opens a pathway for new device designs for solar cells, transistors, and power electronics. Further, closely spaced contact regions may be formed using low-cost nanoimprint technology to properly space and size the emitter and back-contact regions, while allowing very close metal finger tolerances for nearly full metal coverage.

Nanoimprint technology may allow 5 μm structures over cm length scales that may be optimized with 3D device modeling.

Figure 1:
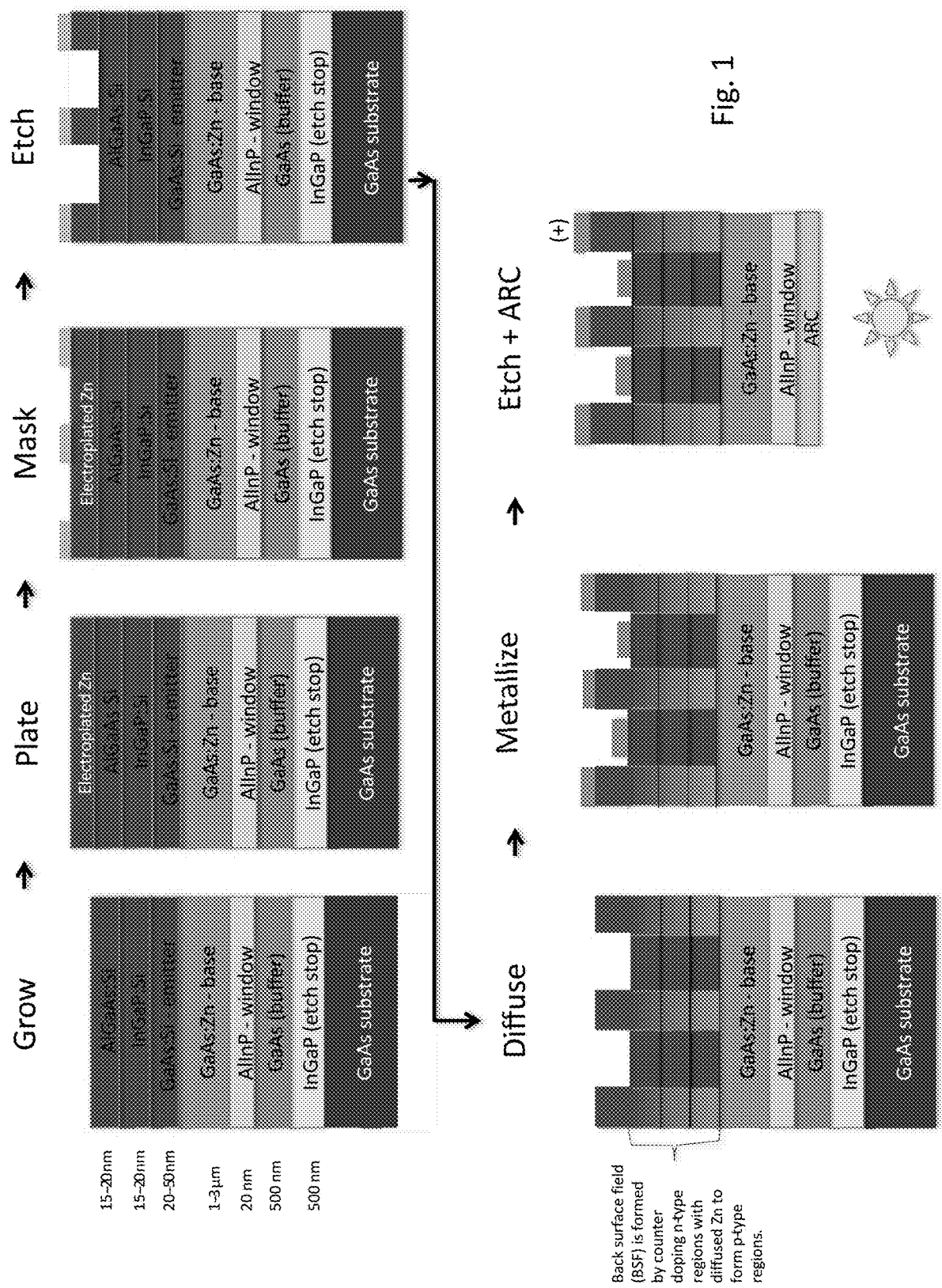
FIG. 1 depicts a flowchart of an exemplary embodiment of a method for forming an IBC solar cell from III-V materials.
Figure 2:
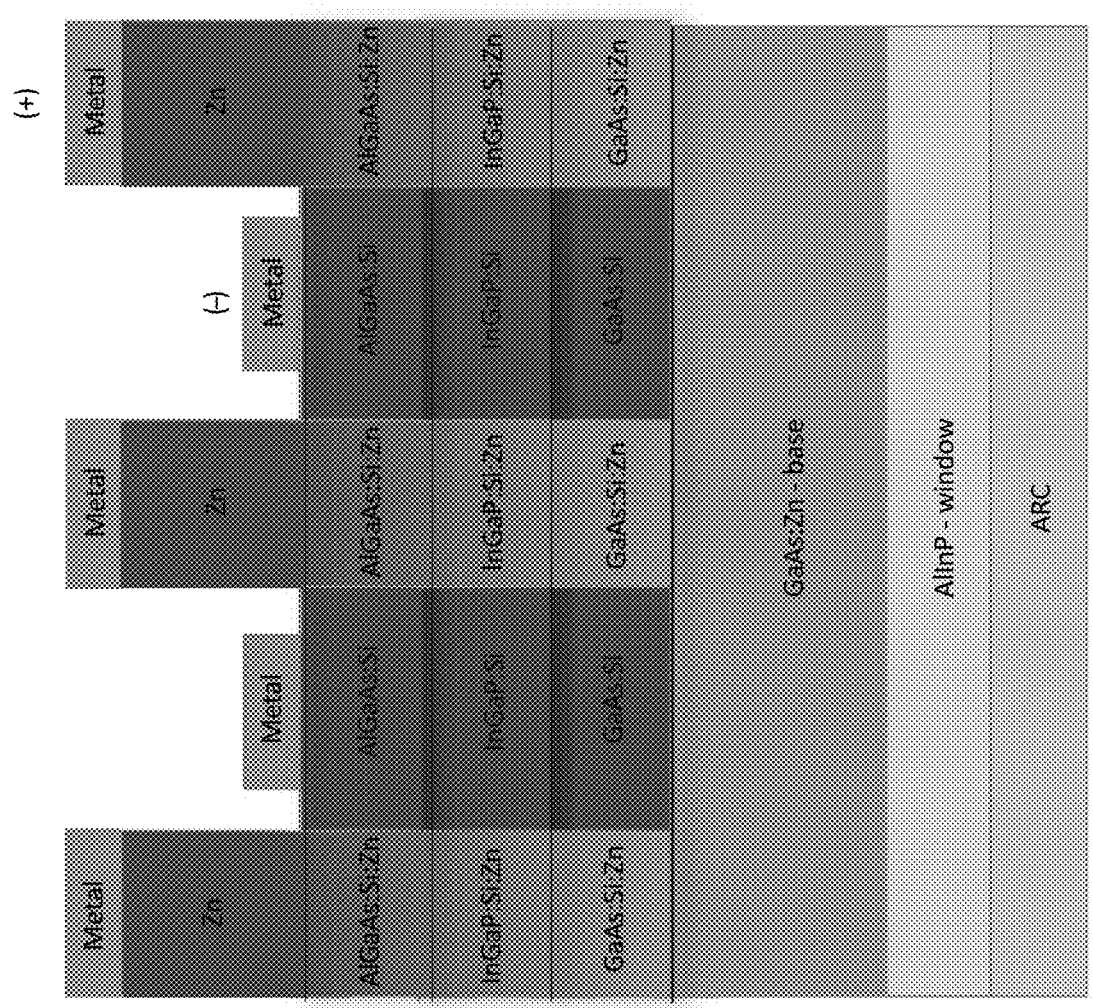
FIG. 2 depicts an enlarged view of a completed IBC solar cell using III-V materials.

FIG. 1 shows a flowchart of an exemplary embodiment of a method for forming an IBC solar cell from III-V materials. The method begins with a Grow step, during which various III-V layers are deposited by any suitable method, such as metalorganic chemical vapor deposition (MOCVD), molecular beam epitaxy (MBE), or hydride vapor phase epitaxy (HVPE). In this example, an InGaP etch stop layer and a p-type GaAs buffer layer may be grown on a GaAs substrate for later removal of the GaAs substrate. Alternatively, one or more layers may be grown for later removal of the GaAs substrate by epitaxial liftoff. For example, growing an AlAs layer that can be selectively etched would allow for the GaAs substrate to be reused. Next, an AlInP window layer is deposited on the p-type GaAs buffer layer to provide a wide band gap front passivation layer for the p-type GaAs buffer layer. The AlInP window layer may be undoped, p-type for a front surface field, or n-type for a floating front emitter region. A p-type GaAs:Zn base layer, which functions as the main optical absorption region, is grown next on the AlInP window layer. A homojunction emitter made of GaAs doped with any suitable n-type dopant, such as Si, Se, S, or Te, is then deposited on the p-type GaAs:Zn base layer. For simplicity, FIG. 1 shows Si as the n-type dopant (for example, the homojunction emitter layer is labeled as GaAs:Si), but the Si may be replaced by any other suitable n-type dopant in any of the n-type layers shown in FIG. 1. Next, an n-type InGaP:Si minority carrier confinement layer is grown on the GaAs:Si homojunction emitter, and an n-type AlGaAs:Si contact layer is grown on the InGaP:Si minority carrier confinement layer to provide good Ohmic contact. Approximate ranges for the thicknesses of the various layers are depicted in FIG. 1. In an embodiment, the thickness of the various layers at the end of the Grow stage include a layer of AlGaAs:Si of from about 15 to about 20 nm adjacent to a InGaP:Si layer of from about 15 to about 20 nm adjacent to a GaAs:Si-emitter layer of from about 20 to about 50 nm adjacent to a GaAs:Zn-base layer of from about 1 to about 3 μm adjacent to a AlInP-window layer of about 20 nm adjacent to a GaAs (buffer) layer of about 500 nm adjacent to a InGaP (etch stop) layer of about 500 nm which is adjacent to a GaAs substrate. As depicted in FIG. 1 and FIG. 2, materials that are p-type are shown in blue, while materials that are n-type are shown in red.

As shown in FIG. 1, the method continues with the Plate step, in which a Zn layer is electroplated on the n-type AlGaAs:Si layer for subsequent diffusion of the p-type contacts. Although Zn is used here as an example, any other suitable p-type dopant with a sufficiently high diffusion coefficient may also be used. The Mask step then covers regions that will be subsequently diffused with Zn with any suitable mask. The Mask step may be performed by nanoimprinting or photolithography. The Etch step removes Zn from regions that will remain emitter regions for the solar cell by etching away regions of the Zn layer that are not covered with the mask. The mask is removed after the Etch step.

The Diffuse step leverages the larger diffusion coefficient of Zn over the n-type dopant, such as Si, Se, S, or Te, to drive Zn into the three layers of the emitter region, which includes the AlGaAs:Si contact layer, the InGaP:Si minority carrier confinement layer, and the GaAs:Si homojunction emitter. The diffusion is performed by annealing, and an overpressure of As or P may be used. The Zn (or other suitable p-type dopant) is only driven into areas of the emitter region corresponding to areas of the Zn layer that were not removed during the Etch step. These areas are shown in greater detail in FIG. 2, where they are labeled as AlGaAs:Si:Zn, InGaP:Si:Zn, and GaAs:Si:Zn, respectively. The patterned Zn diffusion will counter-dope these areas of the emitter region, such that previously n-type materials become p-type materials, to form a passivated back contact region that includes passivated back contact areas to the GaAs:Zn base layer. The passivated back contact region forms a back surface field. The remaining areas of n-type materials form the emitter region.

The diffusion profile within the passivated back contact region may vary as a function of the depth (i.e., the distance from the Zn layer). For example, areas that are closer to the Zn layer may have a higher concentration of Zn than areas that are farther from the Zn layer. The thicknesses of the layers within the passivated back contact region are much thinner (less than about 100 nm) than the widths of the areas within the n-type emitter region and the p-type passivated back contact region (about 5 μm each) to minimize lateral counter-doping that could affect the cell functionality. Si is a slow diffuser in GaAs, while Se promotes Zn diffusion through a vacancy and interstitial kickout mechanism coupled with Coulombic attraction of Zn to substitutional Se on As sites. The p-type back contact region will be passivated by the counter-doped p-type InGaP:Si:Zn layer, while the n-type emitter region will remain as epitaxially grown. This will provide a GaAs/InGaP passivated interface for both the emitter region and the back contact region.

The Metallize step then forms a metal layer on the exposed back surfaces. The metal may be formed on part or all of each surface. However, adjacent metal regions should not touch each other. Any appropriate metal may be used, such as Ni or Au. Finally, in the Etch+ARC step, the GaAs substrate and the InGaP etch stop layers are removed by etching, an antireflective coating (ARC) is deposited on the AlInP window layer. FIG. 2 depicts an enlarged view of a solar cell that is formed by the method described above. In an embodiment, and as depicted in FIG. 2, the positive and negative symbols represent the positive and negative terminals of the solar cell.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method comprising:
    depositing a patterned Zn layer to cover first areas of an n-type emitter region, wherein the n-type emitter region includes an emitter layer, a minority carrier confinement layer, and a contact layer;
    wherein the n-type emitter region is doped with at least one of Si, Se, S, or Te;
    wherein the depositing of the patterned Zn layer comprises electroplating a Zn layer on the emitter region;
    forming a mask on the first areas of the Zn layer corresponding to the first areas of the emitter region;
    wherein the mask is formed by nanoimprinting or microlithography; and
    removing Zn from second areas of the emitter region that are not covered by the mask;
    wherein the emitter region comprises a III-V material; and
    forming a passivated back contact region by counter-doping the first areas of the emitter region by diffusing Zn from the patterned Zn layer into the first areas of the emitter region, such that the first areas of the emitter region become p-type;

wherein the passivated back contact region forms a back surface field.

2. The method according to claim 1, wherein the Zn is diffused such that a concentration of the Zn within the passivated back contact region decreases from an interface with the patterned Zn layer to an interface with a base layer on a side of the passivated back contact region opposite to the patterned Zn layer.

3. The method according to claim 1, further comprising depositing a metal layer on at least a portion of the patterned Zn layer and at least a portion of the second areas of the emitter region.

* * * * *